(12) United States Patent
Moody et al.

(10) Patent No.: US 7,498,584 B2
(45) Date of Patent: Mar. 3, 2009

(54) RADIATION SENSOR

(75) Inventors: Ian Moody, Chelmsford (GB);
Raymond Thomas Bell, Stanmore (GB)

(73) Assignee: E2V Technologies (UK) Limited, Chelmsford (GB)

(*) Notice: Subject to any disclaimer, the term of this patent is extended or adjusted under 35 U.S.C. 154(b) by 247 days.

(21) Appl. No.: 11/513,416

(22) Filed: Aug. 31, 2006

(65) Prior Publication Data
US 2007/0051976 A1 Mar. 8, 2007

(30) Foreign Application Priority Data
Aug. 31, 2005 (GB) ................... 0517742.3

(51) Int. Cl.
*H01L 27/146* (2006.01)
*G01T 1/20* (2006.01)

(52) U.S. Cl. .................... 250/370.09; 250/370.11; 378/9; 378/92

(58) Field of Classification Search ............ 250/370.09, 250/370.11; 378/38, 46, 50; 257/443, 445
See application file for complete search history.

(56) References Cited

U.S. PATENT DOCUMENTS

| | | | |
|---|---|---|---|
| 3,970,884 A * | 7/1976 | Golden | 378/122 |
| 4,873,561 A | 10/1989 | Wen | |
| 5,818,898 A * | 10/1998 | Tsukamoto et al. | 378/98.8 |
| 5,841,833 A | 11/1998 | Mazess et al. | |
| 6,163,029 A | 12/2000 | Yamada et al. | |
| 6,285,740 B1 | 9/2001 | Seely et al. | |
| 6,326,230 B1 | 12/2001 | Pain et al. | |
| 6,381,301 B1 | 4/2002 | Massie | |

(Continued)

FOREIGN PATENT DOCUMENTS

EP 0708554 4/1996

(Continued)

OTHER PUBLICATIONS

British Search Report dated Nov. 25, 2005.

(Continued)

*Primary Examiner*—David P Porta
*Assistant Examiner*—Casey Bryant
(74) *Attorney, Agent, or Firm*—Venable LLP; Robert Kinberg (57) ABSTRACT

An energy selective radiation sensor has a photodetector and a transfer gate for controlling transfer of charge from the photodetector to a first sense node. A first readout circuit is provided for reading out charge from the first node. In use a first charge accumulated in the photodetector from a first predetermined portion of an energy spectrum of a radiation source is transferred to the first sense node. A second charge is accumulated in the photodetector from a second predetermined portion of the energy spectrum. The first charge is readout from the first sense node with the readout circuit, the second charge transferred to the first sense node and likewise readout. In embodiments of the invention, a second sense node and second transfer gate are provided and the first charge is read out through a first sense node and the second charge through the second sense node. In further embodiments a dump drain controlled by a dump gate is also provided to permit duty cycle control of sensitivity of the photodetector by selectively dumping and storing of charge accumulated in the photodetector.

55 Claims, 5 Drawing Sheets

PINNED PHOTODIODE WITH DUMP GATE/DRAIN, 2 TRANSFER GATES
AND SEPARATE READOUT CIRCUITS

U.S. PATENT DOCUMENTS

| | | | |
|---|---|---|---|
| 6,455,831 B1 | 9/2002 | Bandera et al. | |
| 6,496,557 B2 * | 12/2002 | Wilson et al. | 378/21 |
| 6,683,934 B1 | 1/2004 | Zhao et al. | |
| 6,972,794 B1 | 12/2005 | Wang et al. | |
| 2001/0038075 A1 | 11/2001 | Morishita | |
| 2002/0070365 A1 | 6/2002 | Karellas | |
| 2002/0153492 A1 * | 10/2002 | Sekine et al. | 250/370.11 |
| 2003/0164888 A1 | 9/2003 | Orava et al. | |
| 2005/0184218 A1 | 8/2005 | Schauerte et al. | |
| 2005/0285043 A1 * | 12/2005 | Nascetti et al. | 250/370.09 |
| 2006/0289774 A1 * | 12/2006 | Endo et al. | 250/370.09 |
| 2007/0069142 A1 * | 3/2007 | Moody et al. | 250/370.09 |
| 2007/0176109 A1 * | 8/2007 | Bell | 250/370.09 |

FOREIGN PATENT DOCUMENTS

| | | |
|---|---|---|
| EP | 0964570 A2 | 12/1999 |
| EP | 1707990 A2 * | 10/2006 |
| JP | 200349269 | 12/2000 |
| JP | 2004080410 | 3/2004 |

OTHER PUBLICATIONS

European Search Report dated Aug. 1, 2007, directed to counterpart EP 06 25 4497 application number (2 pages).

* cited by examiner

SIMPLE PHOTOGATE

FIG. 3

PHOTOGATE WITH DUMP GATE AND DRAIN

FIG. 4

PINNED PHOTODIODE WITH 2 TRANSFER GATES AND SEPARATE READOUT CIRCUITS

FIG. 5

PINNED PHOTODIODE WITH DUMP GATE/DRAIN, 2 TRANSFER GATES AND SEPARATE READOUT CIRCUITS

FIG. 6

PHOTOGATE WITH SECOND TRANSFER GATE AND STORAGE GATE

FIG. 7

PHOTO-GATE WITH SECOND TRANSFER GATE, SECOND STORAGE GATE AND DUMP GATE AND DRAIN

RADIATION SENSOR

CROSS-REFERENCE TO REALATED APPLICATIONS

This application claims priority from Application No. GB0517742.3 filed in the United Kingdom on Aug. 31, 2005, the disclosure of which is incorporated herein by reference.

This invention relates to an energy selective radiation sensor and a method of operating a radiation sensor for energy selection. The invention has application to imaging using a radiation generator, such as an x-ray generator, which periodically generates at least two spectra of differing energies to generate at least two images in quick succession synchronized with the at least two different spectra. The two images may be processed and displayed either separately or combined, in order to produce an image with improved contrast or spectral information.

The invention has particular application to x-ray imaging and, in particular, to intra-oral dental x-ray imaging.

BACKGROUND OF THE INVENTION

Intra-oral x-ray imaging using a solid-state x-ray sensor is known. Bitewing x-ray images are used for crowns of teeth, that is a portion of the teeth above a gum, for both upper and lower teeth in a portion of a mouth. Bitewing x-rays are used to examine a thick, dense part of a tooth, e.g. enamel and dentine, and are used to determine thickness of enamel and the presence of decay (caries) between teeth. A best image contrast could in principle be obtained using a high-energy portion of a dental x-ray spectrum, e.g. between 35 keV and 70 keV, but typically a broad spectrum between 10 keV and 70 keV is used.

Periapical x-rays images show an entire tooth, including a root and surrounding bone. The root fits into fibrous bone below the gum, and is usually twice as long as the crown. Periapical x-rays examine a thin, less dense portion of the tooth and the low-density fibrous bone surrounding the root. Periapical x-rays are used to examine for root fracture, bone loss due to gum disease, and condition of root canal and periodontal ligament (which supports the tooth in its bony socket). Since bone loss can be caused by gum disease, detail of the gum where it meets the tooth is important. Periapical x-rays are also used to aid diagnosis following presentation of symptoms of pressure sensitivity, e.g. diagnosis of an abscess or cyst in the fibrous bone at the base of the root. In all cases, periapical x-rays are used to examine low density tooth and bone and image detail may be of soft tissue. Best image contrast could in principle be obtained by taking advantage of photo-electric x-ray attenuation in soft tissue using a low-energy portion of the dental x-ray spectrum, e.g. between 10 keV and 35 keV, but typically a broad spectrum between 10 keV and 70 keV is used.

Because different photon energies are required to obtain high resolution, high contrast images for different portions of a tooth and the surrounding tissue, it is not normally possible to obtain a single high resolution, high contrast image of a whole tooth and the surrounding tissue with a single exposure.

In other known systems:

a second image is generated after a first image is read out, which for a large area sensor typical of intra-oral, mammo- or chest radiography, could take several seconds—registration of the two images will usually be adversely affected due to motion effects;

the two images may be generated from two different sensors and the spatial registration may be poor;

the two images may be generated via filtering in order to obtain high and low sensor channels, and such filtering can rarely achieve desirable characteristics such as sharp cut-off and discrimination of the pass-bands.

U.S. Pat. No. 6,381,301 describes a system which uses two complete mechanical scans of an object at two different x-ray energies. The two scan images are then combined. There is likely to be poor registration of the two images since each of the scans is likely to take at least 10 seconds and the object may move between the scans. The registration also depends on generator and detector positioning accuracy.

U.S. Pat. No. 6,285,740 describes a dual-energy x-ray system, in which the detector consists of a soft x-ray detector and a hard x-ray detector in tandem, with an inter-detector filter in between. Alternatively suitable high energy/low energy scintillators are arranged to produce light of different colours, which are then imaged by CCD detectors for the capture of separate images. The detector is likely to have poor selectivity of the two x-ray energies. The sensitivity for the higher x-ray energy is likely to be poor since the high energy photons have to pass through the low energy detector before being imaged. The registration of the two images is likely to be poor because two detectors are used, also the inter-detector filter may produce undesirable spatial offsets.

U.S. Pat. No. 5,841,833 describes a dual energy detector with high and low energy detecting elements each based on an x-ray sensitive scintillator and a photodiode, arranged alternately in at least two rows and with low and high energy detector elements also arranged in columns of alternating high and low energy detector elements perpendicular to the rows. There is interpolation of the signals from adjacent, e.g. high energy pixels, and the signals are combined to produce an interpolated value for a virtual detecting element of high energy. The system is based on a linear, not an area, array, and hence the object must be scanned. The arrangement of the detector pixels is described, but not how the adjacent low and high x-ray energy pixels are actually realised. There may, for instance, be poor discrimination of the two x-ray energies.

U.S. Pat. No. 6,683,934 describes first and second filters which are selectively switched so as to be disposed between a source and a space accommodating a body, independently and respectively, for first and second, different x-ray energy levels. The filters interposed can never be ideal and the system is likely to have poor discrimination of the two x-ray energies.

It is an object of the present invention at least to ameliorate the aforesaid shortcomings in the prior art.

BRIEF SUMMARY OF THE INVENTION

According to a first aspect of the present invention there is provided a method of selective energy imaging of X-radiation comprising the steps of: providing an imaging pixel structure having photodetector means for converting incident radiation to electrical charge; first charge storage means; first charge transfer control means for controlling transfer of charge from the photodetector to the first charge storage means; and first readout means for reading out charge from the first charge storage means; setting the charge transfer control means to prevent transfer of a first charge from the photodetector means to the first charge storage means; accumulating the first charge in the photodetector means from radiation incident on the photodetector means in a first portion of a time-varying energy spectrum emitted by a radiation source, corresponding to a first predetermined energy range selected from the energy spectrum; setting the first charge transfer control means to transfer the first charge from the photodetector means to the first charge storage means; and using the first readout means to read out the first charge from the first charge storage means.

Conveniently, the step of setting the first charge transfer control means to transfer the first charge includes the further steps thereafter of: setting the first charge transfer control means to prevent transfer of a second charge from the photodetector means to the first charge storage means; accumulating the second charge in the photodetector means from radiation incident on the photodetector in a second portion of the time-varying energy spectrum emitted by the radiation source corresponding to a second predetermined energy range selected from the energy spectrum; and the step of reading out the first charge includes the further steps thereafter of: setting the first charge transfer control means to transfer the second charge from the photodetector means to the first charge storage means; and reading out the second charge from the first charge storage means.

Advantageously, the step of providing an imaging pixel structure includes providing first reset means for eliminating charge from the first charge storage means and the step of setting the first charge transfer control means to prevent transfer of the first charge includes preceding steps of: setting the first charge transfer control means to transfer charge from the photodetector means to the first charge storage means; transferring dark current charge accumulated in the photodetector means to the first charge storage means; and using the first reset means to eliminate the dark current charge from the first charge storage means.

Conveniently, the step of providing photodetector means comprises providing a scintillator layer coupled to a pinned photodiode or a photo-gate.

Optionally, the step of providing photodetector means comprises providing a photoconductor layer coupled to a diode.

Optionally, the step of providing photodetector means comprises providing a pinned photodiode or a photo-gate which is intrinsically sensitive.

Advantageously, the step of providing an imaging pixel structure includes providing dump gate means arranged for controlling charge transfer from the photodetector means to dump drain means and the step of transferring charge to the charge storage means includes selectively transferring charge to the dump drain means to affect the effective sensitivity of the photodetector means.

Conveniently, the step of providing an imaging pixel structure includes providing scintillator means for converting radiation from the radiation source to output radiation suitable for detection by the photodetector means and the step of affecting the effective sensitivity of the photodetector means comprises matching the sensitivity of the photodetector means to the output of the scintillator means.

Advantageously, charge accumulated from radiation incident on the photodetector means in a third portion of the time-varying spectrum emitted of the radiation source, corresponding to a third predetermined energy range of the energy spectrum, is dumped in the dump drain.

Conveniently, the step of providing an imaging pixel structure includes providing second charge storage means; and second charge transfer control means for controlling transfer of charge from the photodetector to the second charge storage means; and the step of reading out the first charge includes the further steps thereafter of: setting the second charge transfer control means to transfer the second charge from the photodetector means to the second charge storage means; and reading out the second charge from the second storage means.

Advantageously, the step of providing an imaging pixel structure includes providing a second readout means for reading out charge from the second charge storage means and the step of reading out the second charge from the second storage means comprises using the second readout means.

Alternatively, the step of reading out the second storage means comprises transferring the second charge sequentially to the photodetector and the first storage means and using the first readout means to read the second charge from the first storage means.

Conveniently, the radiation source is a DC x-ray source emitting x-ray pulses in the first predetermined energy range.

Conveniently, the radiation source is a DC x-ray source emitting x-ray pulses in the second predetermined energy range.

Alternatively, the radiation source is an AC x-ray source and the first predetermined energy range is a first continuum of energies emitted by the AC x-ray source using tube voltages within a first range.

Conveniently, the radiation source is an AC x-ray source and the second predetermined energy range is a second continuum of energies emitted by the AC x-ray source using tube voltages within a second range.

According to a second aspect of the invention, there is provided an imaging pixel structure including photodetector means for converting incident X-radiation to electrical charge; first charge storage means; first charge transfer control means for controlling transfer of charge from the photodetector means to the first charge storage means; and first readout means for reading out charge from the first charge storage means, characterised by: the pixel structure being arranged to accumulate a first charge in the photodetector means from radiation incident on the photodetector means in a first portion of a time-varying energy spectrum emitted by a radiation source, corresponding to a first predetermined energy range selected from the time-varying energy spectrum; to transfer the first charge from the photodetector means to the first charge storage means; and to use the first readout means to read out the first charge from the first charge storage means.

Advantageously, the imaging pixel structure is arranged to accumulate a second charge in the photodetector means from radiation incident on the photodetector means in a second portion of the time-varying energy spectrum corresponding to a second predetermined energy range selected from the energy spectrum; to transfer the second charge from the photodetector means to the first charge storage means; and to use the first readout means to read out the second charge from the first charge storage means.

Conveniently, the imaging pixel structure further comprises second charge storage means; second charge transfer control means for controlling transfer of charge from the photodetector to the second charge storage means; the pixel structure being arranged to accumulate a second charge in the photodetector means from radiation incident on the photodetector means in a second predetermined energy range selected from the energy spectrum of the radiation source; and to transfer the second charge from the photodetector means to the second charge storage means.

Conveniently, the imaging pixel structure further comprises second readout means arranged to read out charge from the second charge storage means.

Alternatively, the imaging pixel structure is arranged to transfer charge from the second charge storage means to the photodetector means and from the photodetector means to the first storage means to read out the second charge using the first readout means.

Conveniently, the imaging pixel structure further comprises dump charge transfer control means for transferring charge from the photodetector means to dump drain means arranged to vary an effective sensitivity of the photodetector means.

Advantageously, the imaging pixel structure further includes scintillator means for converting radiation from the radiation source to output radiation suitable for detection by the photodetector means, the pixel structure being arranged to vary the effective sensitivity of the photodetector means to match the output of the scintillator means.

Conveniently, the photodetector means comprises a scintillator layer coupled to a pinned photodiode or a photo-gate.

Optionally, the photodetector means comprises a photoconductor layer coupled to a diode.

Optionally, the photodetector means comprises a pinned photodiode or a photo-gate which is intrinsically sensitive.

Conveniently, the second charge storage means includes a storage gate.

Conveniently, at least one of the first and second charge storage means includes a sense node.

According to a third aspect of the invention, there is provided a sensor array comprising an imaging pixel structure as described above.

Advantageously, the sensor array is arranged for x-ray imaging.

Advantageously, the sensor array is arranged for intra-oral dental x-ray imaging.

BRIEF DESCRIPTION OF THE SEVERAL VIEW OF THE DRAWINGS

The invention will now be described, by way of example, with reference to the accompanying drawings in which.

In the Figures like reference numerals denote like parts.

DETAILED DESCRIPTION OF THE INVENTION

It is an object of the invention to provide an x-ray sensor, which includes a facility to synchronize its signal charge collection with either a pulsed DC, or an AC, broad-spectrum x-ray source, in such a way as preferentially to select low-energy x-ray photons, or high energy x-ray photons, in a particular collection/readout frame. For a pulsed DC x-ray source, x-ray exposure may consist of a series of short pulses with different x-ray tube voltages. For an AC x-ray source, x-ray output has a cyclical variation of energy at the line frequency.

Currently available DC x-ray generators often have a selectable tube voltage, eg 60 kV (giving a broad spectrum from 10 keV to 60 keV) or 70 kV (giving a broad spectrum from 10 keV to 70 keV). It is preferable to change the two voltages to 35 kV and 70 kV to obtain the periapical and bitewing spectra for use in the method described below. Currently available AC x-ray generators already have a known periodic variation of x-ray energy over the required range and should be able to be used with the method described below without modification.

An objective is to enhance contrast of a particular image frame for either the low, or the high density, parts of an object under x-ray examination, whilst still using a same, broad spectrum, x-ray source. Alternatively, two frames may be taken in quick succession, a first optimised in contrast for low density, and a second for high density, portions of an object. The two frames are then combined with good registration to show detail in both the low and high density portions of the object—even when the object is moving or changing rapidly. This provides an advantage over two examinations carried out one after the other, which may not capture an object in a same part of a frame.

A particular application of the invention is in intra-oral dental x-ray imaging. Contrast of a particular image frame can be optimized for low, or high, density portions of teeth under examination. For low-density bone and soft tissue (periapical x-rays), photo-electric attenuation is accentuated by use of a low-energy portion of a dental x-ray spectrum. To provide good contrast for the dense crown of the tooth (bitewing x-rays), a high-energy portion of the dental x-ray spectrum is used. Alternatively two frames may be taken in quick succession, the first optimised in contrast for the low density, and the second for the high density, portions of the teeth. The two frames are then combined with good registration to show detail in both the low and high density portions. The capture of these two images in a single exposure ensures accurate registration between the two to facilitate image processing and may also minimise a dose delivered to a patient.

Energy selection, as described herein, can also be combined with selective sensitivity of an x-ray sensor, for example for scintillator matching, as disclosed in the Applicant's co-pending application entitled "Image sensor" under the Applicant's reference number P110450GB, in which charge a generated in a sensor is selectively stored and dumped, for example by storing charge in an on-off duty cycle.

Figure 1:
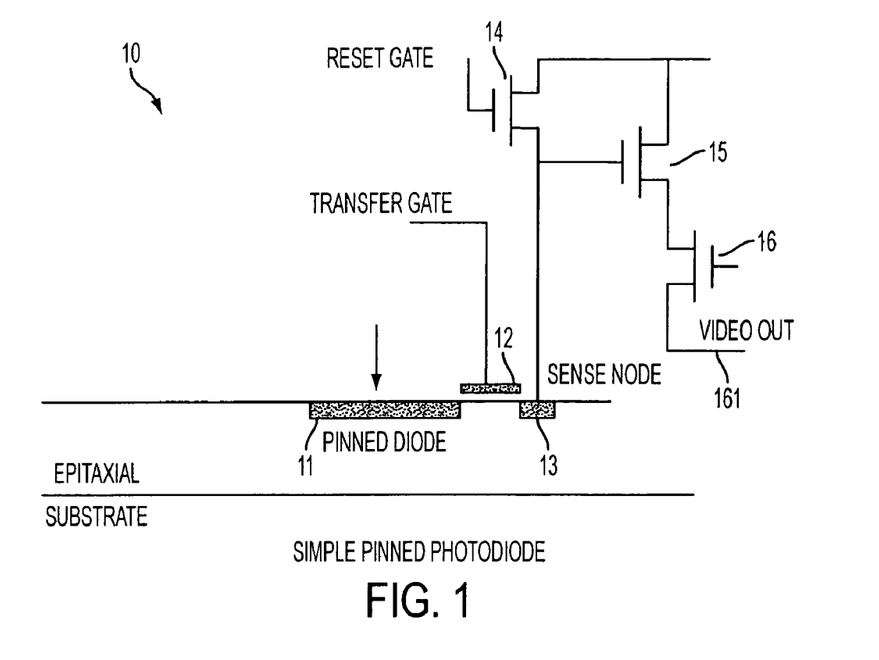
FIG. 1 is a schematic diagram of a known first pixel structure of an x-ray solid-state sensor, suitable for use with the invention, having a pinned photodiode with a transfer gate.

A first basic three transistor pixel 10, as shown in FIG. 1, suitable for use with the invention, has a pinned photodiode 11 and includes a transfer gate 12 controlling charge transfer from the pinned diode 11 to a sense node 13. The pixel includes a reset transistor 14 having an output connected to the sense node 13, a source follower, buffer transistor 15 with its gate connected to the sense node 13 and a pixel switch transistor 16 which connects an output of the source follower 15 to a video out line 161.

Figure 2:
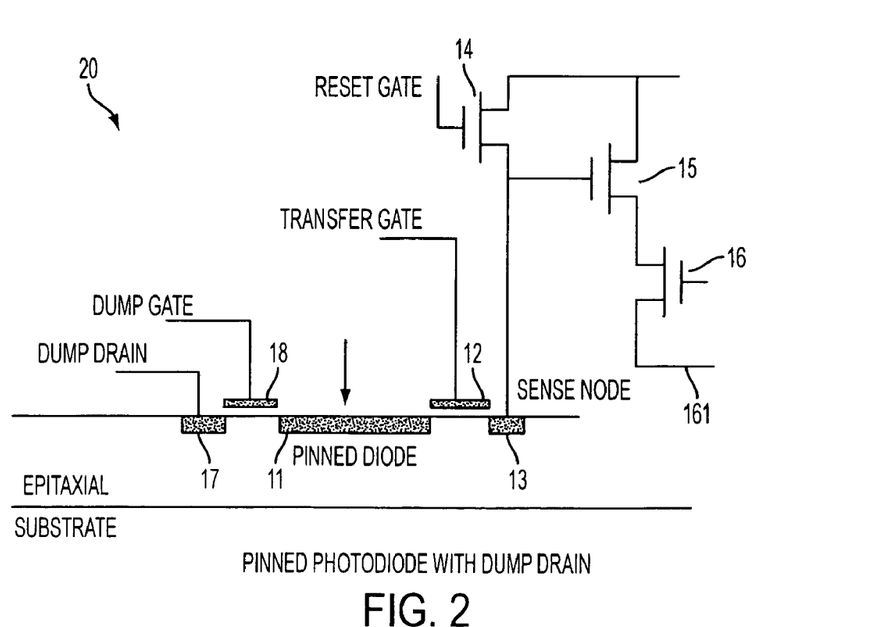
FIG. 2 is a schematic diagram of a second pixel structure of an x-ray solid-state sensor, suitable for use with the invention, having a pinned photodiode with a transfer gate and a dump gate and dump drain.

A second pixel structure, shown in FIG. 2, also suitable for use with the invention, is similar to the first pixel structure of FIG. 1, but has in addition a dump gate 18 controlling charge transfer from the pinned photodiode 11 to a dump drain 17.

Figure 3:
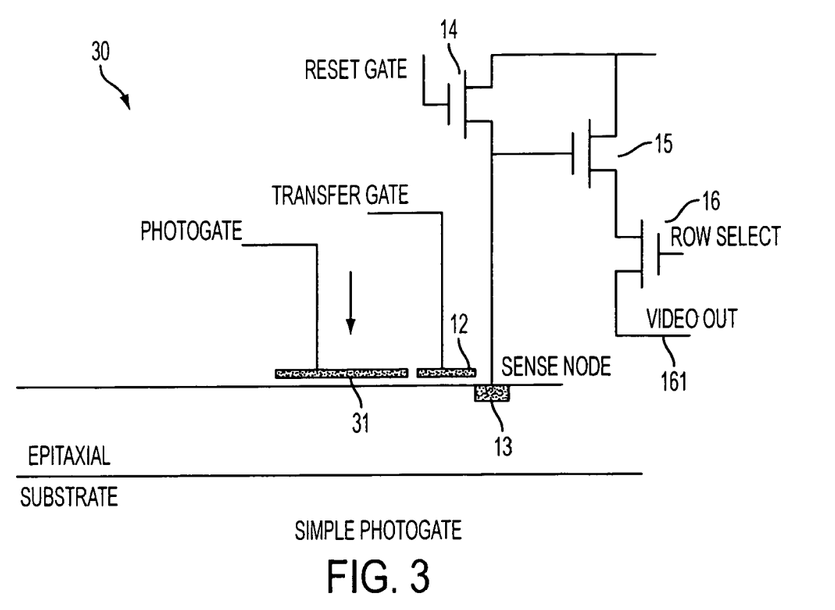
FIG. 3 is a schematic diagram of a known third pixel structure of an x-ray solid-state sensor, suitable for use with the invention, having a photo-gate with a transfer gate.

A third pixel structure, shown in FIG. 3, is also suitable for use with the invention, and is identical to the first structure of FIG. 1, but with the pinned photodiode 11 of the first pixel structure replaced by a photo-gate 31.

Figure 4:
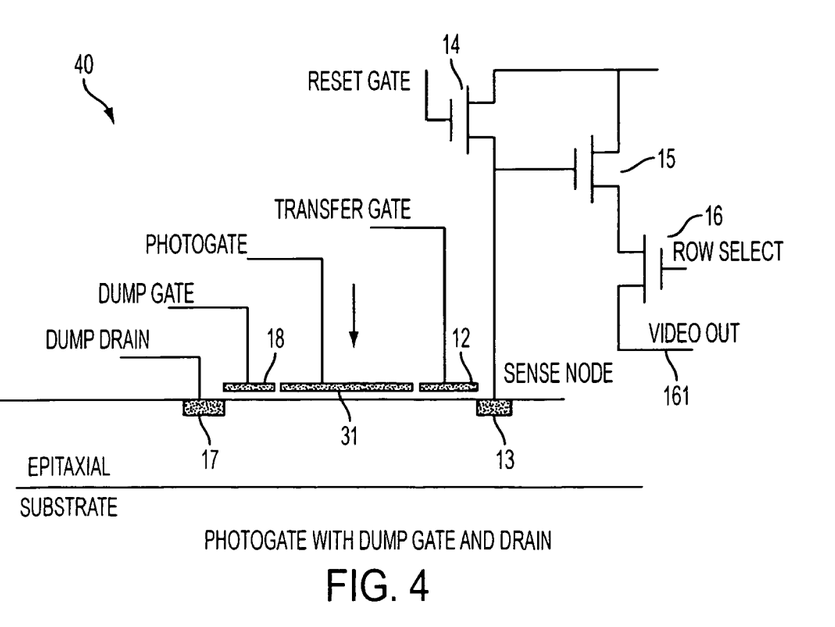
FIG. 4 is a schematic diagram of a fourth pixel structure of an x-ray solid-state sensor, suitable for use with the invention, with a photo-gate, a transfer gate and a dump gate and dump drain.

Similarly, a fourth pixel structure, shown in FIG. 4, is also suitable for use with the invention, and is identical to the second structure of FIG. 2, but with the pinned photodiode 11 of the second pixel structure replaced by a photo-gate 31.

Referring to FIGS. 5 to 8, fifth, sixth, seventh and eighth pixel structures 50, 60, 70, 80 comprise a pinned photodiode 51, 61 or photo-gate 71, 81 with two independent transfer gates 521, 522; 621, 622; 721, 722; 821, 822, which allow charge transfer to two separate storage locations/sense nodes 531, 532; 631, 632; 731, 74; 831, 84 respectively.

Figure 5:
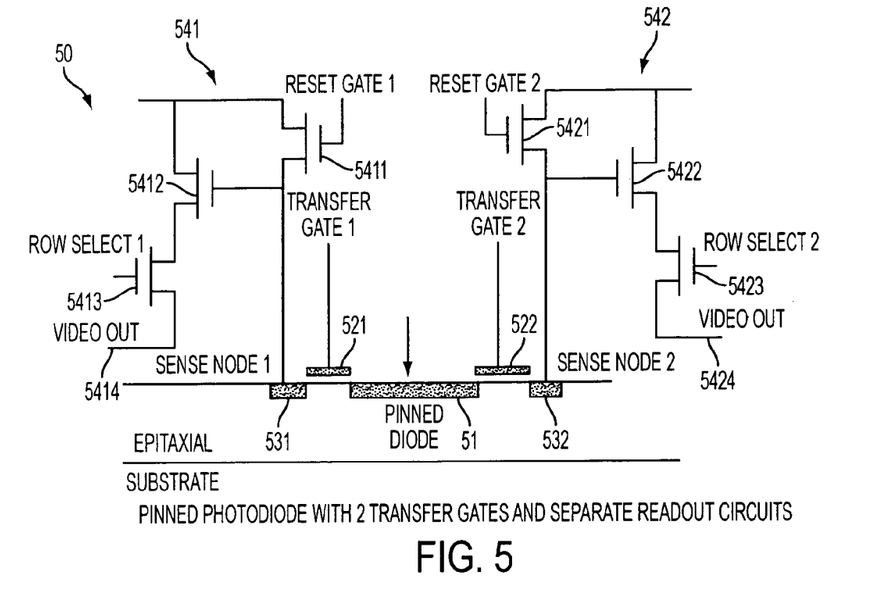
FIG. 5 is a schematic diagram of a fifth pixel structure of an x-ray solid-state sensor suitable for use with the invention, having a pinned photodiode with two transfer gates and separate readout circuits, one associated with each transfer gate respectively.
Figure 6:
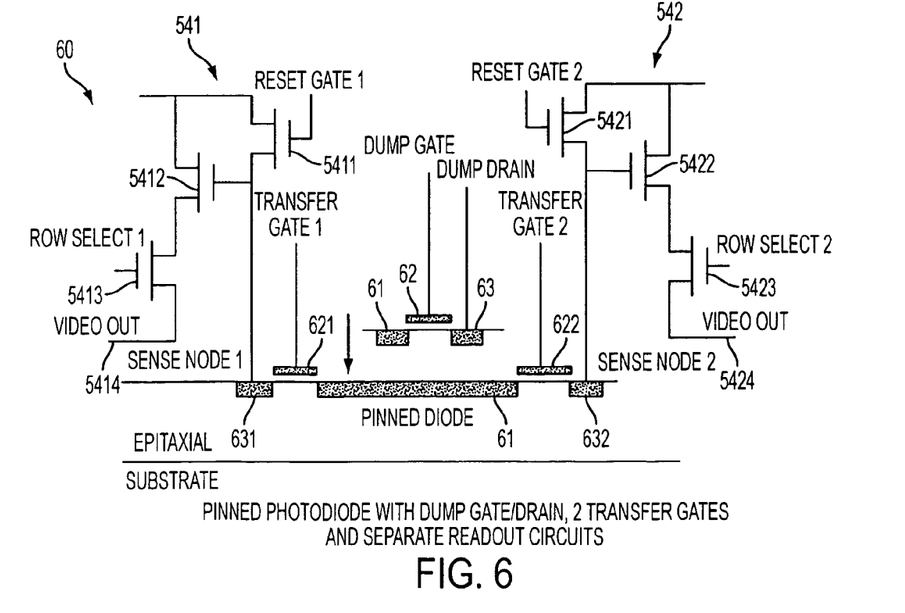
FIG. 6 is a schematic diagram of a sixth pixel structure of an x-ray solid-state sensor according to the invention, having a pinned photodiode, with two transfer gates, a dump gate and dump drain and separate readout circuits, one associated with each transfer gate respectively.

Referring to FIGS. 5 and 6, the fifth and sixth pixel structures 50, 60 each include two readout circuits 541, 542 each comprising a sense node 531, 532; 631, 632, a reset switch 5411, 5421 having an output connected to the sense node, a source follower 5412, 5422 having a gate connected to the sense node and a select switch 5413, 5423 connected to an output of the source follower and having a video output 5414, 5424 with first and second transfer gates 521, 522; 621, 622 connecting a common photodiode 51, 61 to the sense nodes 531, 532; 631, 632. Although the connections to the two readout circuits are shown in FIGS. 5 and 6 as separate, at least some of the power supply, reset gate 5411, 5421, row select 5413, 5423 and video out 5414, 5424 connections could alternatively be common to the two readout circuits of the fifth and sixth pixel structures 50, 60. If the row select 5413, 5423 line is shared, separate video out 5414, 5424 connections are required and the two signals are output simultaneously. If the video out 5414, 5424 connection is shared, separate row select 5413, 5423 connections are required and the two signals are output sequentially.

Referring, to FIG. 6, the sixth pixel structure 60 is the same as the fifth pixel structure 50 apart from an additional dump gate 62 controlling charge transfer from the pinned photodiode 61 to a dump drain 63.

Figure 7:
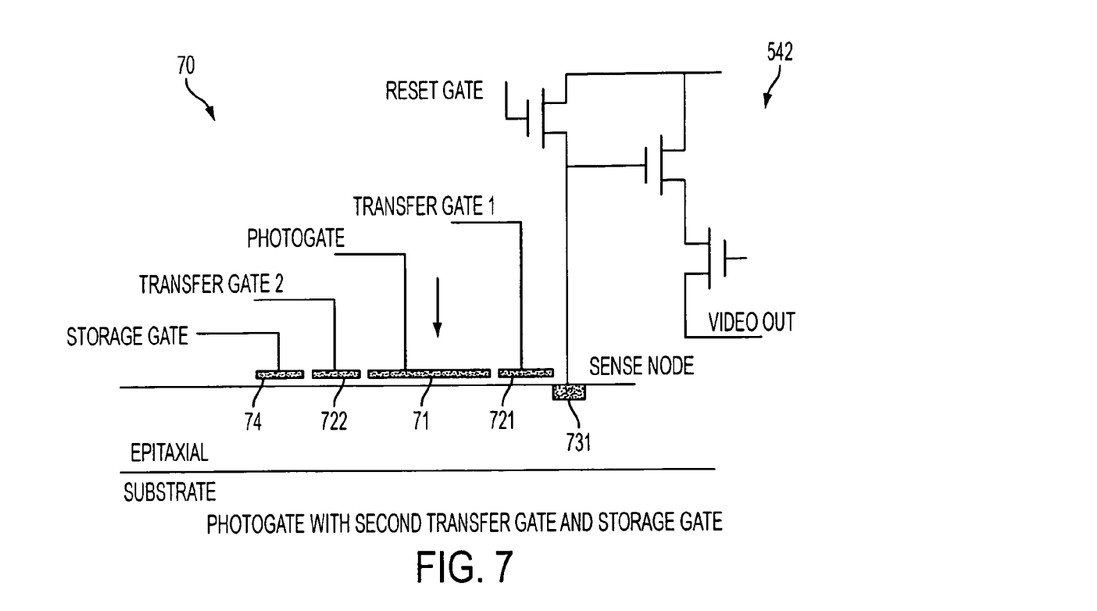
FIG. 7 is a schematic diagram of a seventh pixel structure of an x-ray solid-state sensor suitable for use with the invention, having a photo-gate with fist and second transfer gates and a storage gate.

Referring to FIG. 7, a seventh pixel structure 70 uses a sense node 731 as a first storage location and an additional storage gate 74 as a second storage location. Therefore, only a single readout circuit 542, connected to the sense node 731 is provided. A means to transfer charge from the second storage location 74 to the sense node 731 is therefore required, and is described below. This is in effect a mini CCD in each pixel.

Figure 8:
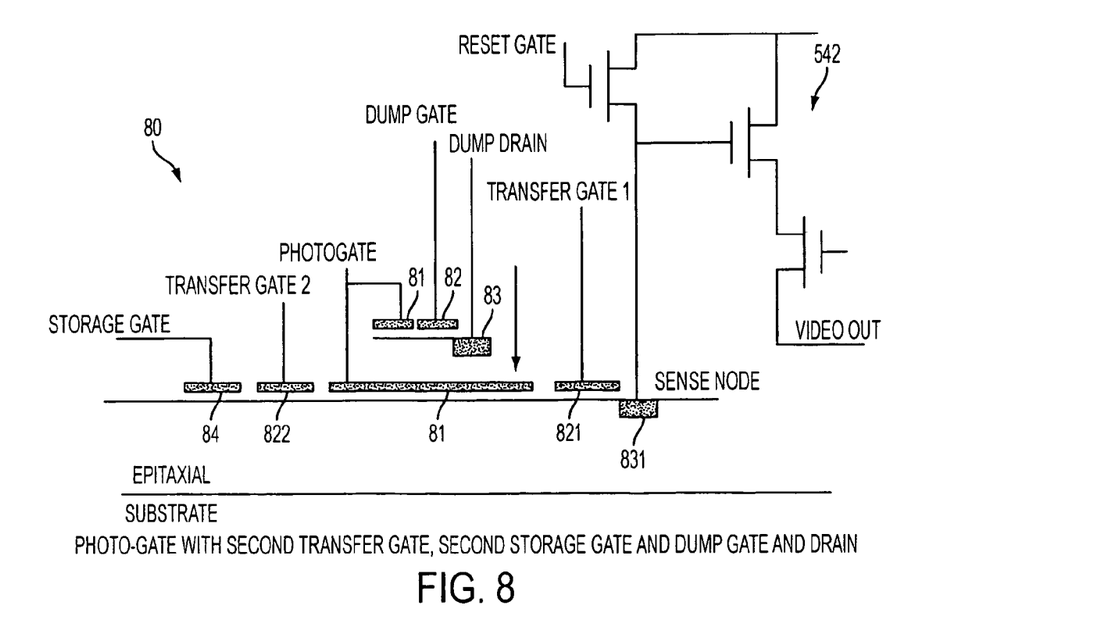
FIG. 8 is a schematic diagram of an eighth pixel structure of an x-ray solid-state sensor according to the invention, having a photo-gate with first and second transfer gates, a storage gate, a sensor node and a dump gate and dump drain.

Referring to FIG. 8, an eighth pixel structure 80 is similar to the seventh pixel structure, but has a dump gate 82 and drain structure 83 for dumping charge from the photo-gate 81.

Figure 9:
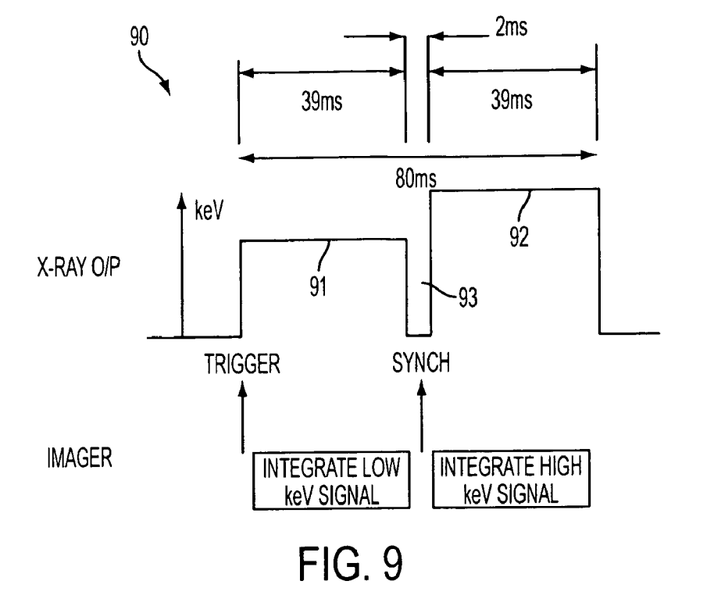
FIG. 9 is a schematic diagram of output of a DC x-ray generator operating at two different energies, suitable for use with the invention.

Referring to FIG. 9, a DC x-ray source for use with the invention is arranged to output a first portion 91 of a programmed exposure 90 at a first energy and a second portion 92 at a second energy, higher than the first energy, with a short synchronizing pause 93 in a middle of the exposure between the first portion and the second portion. For dental x-ray imaging, a suitable duration of the total pulse 90 is 80 ms, and a suitable short synchronising pause is 2 ms.

The DC x-ray source may be used with any of the pixel structures described herein in a basic energy selection mode but for simplicity operation is initially described with the first pixel structure 10 shown in FIG. 1.

In standby mode, dark current charge is continuously, or periodically, transferred from the pinned photodiode 11 to the sense node 13 by holding, or pulsing, respectively, the transfer gate 12 high, and the sense node 13 is reset by holding, or pulsing, a reset pulse high at the reset gate 14.

At a beginning of the first, low energy, x-ray period 91, the reset gate 14 is turned off so that all photo-generated charge is collected in the pinned photodiode 11 and then transferred to the sense node 13 by keeping, or pulsing, the transfer gate 12 high. At an end of the first period 91 all generated charge is therefore on the sense node 13.

The transfer gate 12 is then taken low and held low. Charge generated from the higher energy second x-ray period 92, is collected in the pinned photodiode 11.

After an end of the second x-ray period 92, signals collected are read out in a three-step process. Signal from first period 91 is read out from the sense node, the sense node 13 is reset and signal from second period 92 is transferred from the pinned photodiode to the sense node 13 and read out Some variations of this procedure are possible in common with normal CMOS readout strategies—for example, readout of the reset level between the two signal levels for fixed pattern correction.

Readout of the two sets of data from an array of pixels, corresponding to the first period 91 and the second period 92 could be either as two separate frames with global reset and transfer gate pulses, or on a line interleaved basis with rolling reset and transfer gate pulses. The latter may allow CDS to reduce kTC noise on the second sample.

The energy selection feature can be combined with the sensitivity matching technique described in the Applicant's co-pending application entitled "Image sensor" under reference number P110450GB. For example, energy selection as described may be combined with scintillator matching using the DC x-ray source. That is, the DC x-ray source may be used with the second or sixth pixel structures 20 and 60, shown in FIGS. 2 and 6, in a mode which combines energy selection & scintillator matching.

Charge collection may be performed in any desired part of the first (e.g. low energy) period 91 by appropriate pulsing of the transfer gates 12; 621, 622 and dump gates 18; 62. In this case, a duty cycle can be chosen to match sensitivity of the second sensor pixel structure 20 or the sixth sensor pixel structure 60 to the scintillator output. In the second, e.g. high energy, period 92, however, only charge from a beginning of the period 92 can be dumped for sensitivity control, as pulsing the gate will remove all signal from the photodiode 11; 61.

To select only parts of the signal from the second period 92 for sensitivity control requires the sixth pixel structure 60 or eighth pixel structure 80 illustrated in FIGS. 6 and 8 respectively. The energy selection feature can be combined with sensitivity control, for example, for scintillator matching, in both the low and high energy periods.

Referring to FIG. 6, in the sixth pixel structure 60 charge collection may be performed in any desired part of the first (e.g. low energy) period 91 by appropriate pulsing of the transfer gates 621 and dump gate 62 for the first storage location 631. The duty cycle can be chosen in order to match the sensitivity of the sensor pixel 60 to the scintillator output In the second (e.g. high energy) period 92, pulsing of the dump gate 62 and transfer gate 622 for the second storage location 632 takes place. The duty cycle can be chosen in order to match sensitivity of the sensor pixel 60 to the scintillator output.

Referring to FIG. 8, in the eighth pixel structure 80, charge collection may be performed in any desired part of the first (e.g. low energy) period 91 by appropriate pulsing of the transfer gates 821 and dump gate 82 for the first storage location 831. The duty cycle can be chosen, for example, in order to match the sensitivity of the sensor pixel 80 to the scintillator output. In the second (e.g. high energy) period 92, pulsing of the dump gate 82 and transfer gate 822 takes place for the second storage location 84. The duty cycle can be chosen, for example, in order to match sensitivity of the sensor pixel 80 to the scintillator output.

Figure 10:
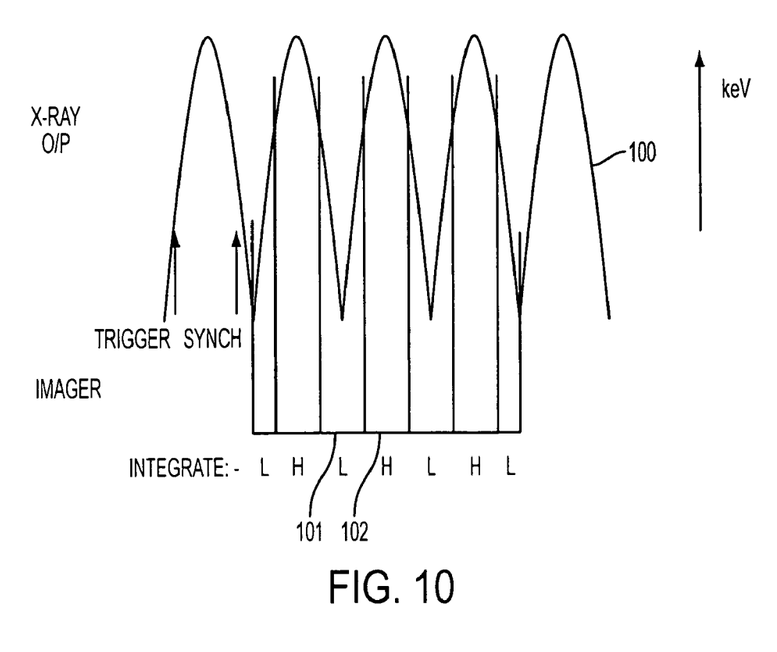
FIG. 10 is a schematic diagram of output of an AC x-ray generator, suitable for use with the invention.

A standard AC x-ray source may also be used with the invention. X-ray energy 100 emitted by the source varies cyclically in a similar way to a fill wave rectified waveform, as illustrated in FIG. 10. Of the described pixel structures, only the sixth pixel structure 60 illustrated in FIG. 6, or the eighth pixel structure 80, illustrated in FIG. 8 can be used with the AC x-ray source for energy selection.

Referring to FIG. 6, in standby mode, dark current charge is continuously, or periodically, transferred from the photodiode 61 to the dump drain 63 or a sense node 631, by holding, or pulsing, respectively, the dump gate 62 and the appropriate transfer gate 621 high, and resetting the sense node 631 by holding, or pulsing, the reset gate 5411 high.

During low energy x-ray periods 101, the reset gates 5411, 5421 are turned off so all photo-generated charge is collected in the photodiode 61 and then transferred to the sense node 631 by keeping, or pulsing, the appropriate transfer gate 621 high.

During high energy x-ray periods 102, the reset gates 5411, 5421 are turned off so all photo-generated charge is collected in the photodiode 61 and then transferred to the second sense node 632 by keeping, or pulsing, the second transfer gate 622 high.

Referring to FIG. 8, in standby mode, dark current charge is continuously, or periodically, transferred from the photogate 81 to the dump drain 83 or the sense node 831, by holding, or pulsing, respectively, the dump gate 82 and the appropriate transfer gate 821 high, and resetting the sense node 831 by holding, or pulsing, the reset gate high.

During low energy x-ray periods 101, the reset gate is turned off so all photo-generated charge is collected in the photodiode 81 and then transferred to the sense node 831 by keeping, or pulsing, the appropriate transfer gate 821 high.

During high energy x-ray periods 102, the reset gate is turned off so all photo-generated charge is collected in the photodiode 81 and then transferred to the storage gate 84 by keeping, or pulsing, the second transfer gate 822 high.

With the sixth pixel structure 60, or the eighth pixel structure 80, a third band of x-ray energies (e.g. corresponding to very low energies of minimal diagnostic value) can be defined for which the signal is always dumped directly to the dump drain 63, 83.

After an end of the x-ray exposure 100, the signals collected are read out as follows. For the fifth and sixth pixel structures 50 and 60 the two sense nodes 531, 532; 631,632 are read out by addressing them sequentially or simultaneously depending on a manner in which connections are commoned, see above.

For the seventh pixel structure 70 and the eighth pixel structure 80, a first signal from the sense node 731, 831 is read out. The sense node 731, 831 is reset. A second signal from the storage gate 74, 84 is transferred to sense node 731, 831 by pulsing the storage gate transfer gate 722, 822 and photo-gate 71, 81 in a typical CCD charge transfer sequence. The second signal from the sense node 731, 831 is read out and the sense node 731, 831 is reset.

Energy selection may be combined with sensitivity matching using the AC x-ray source using the sixth pixel structure 60, or the eighth pixel structure 80. Charge collection may be performed in any desired part of the low energy periods 101 by appropriate pulsing of the first transfer gate 621, 821 and dump gate 62, 82 for the first storage location 631, 831. The duty cycle can be chosen in order to match the sensor pixel sensitivity to output from the scintillator. In the high energy periods 102, pulsing of the second transfer gate 622, 822 and the dump gate 62, 82 for the second storage location 632, 84 takes place. The duty cycle can be chosen in order to match sensitivity of the sensor pixel 60, 80 to scintillator output.

Advantages provided by the invention include:
two images are generated from a same sensor with same optics and separated by only 1 or 2 ms in time;
registration of the two images is excellent, since the same photo-sites are used and the radiation generator is fixed in position;
motion artefacts are minimized, since the two images are taken in quick succession; and
there is excellent separation of high and low input spectra (via time division).

Although the invention has been described in relation to image sensors having photodiodes and photo-gates, it will be understood that the invention is equally applicable to image sensors with other types of photodetector, such as, for example, photoconductor-based image sensors and intrinsically sensitive image sensors. In a photoconductor-based imager an imager is coated with, or attached to, a photoconductor layer. This layer has a bias field $V_{bias}$ applied, for example by means of opposed metal contacts. When charge is generated in the photoconductor, the bias field sweeps the generated charge into a pixel structure. In an intrinsically sensitive imager signal is directly generated in the imager pixel.

We claim:

1. A method of selective energy imaging of X-radiation comprising the steps of:
   a. providing an imaging pixel structure having photodetector means for converting incident radiation to electrical charge; first charge storage means; first charge transfer control means for controlling transfer of charge from the photodetector to the first charge storage means; and first readout means for reading out charge from the first charge storage means;
   b. setting the first charge transfer control means to prevent transfer of a first charge from the photodetector means to the first charge storage means;
   c. accumulating the first charge in the photodetector means from radiation incident on the photodetector means in a first portion of a time-varying energy spectrum emitted by a radiation source, corresponding to a first predetermined energy range selected from the energy spectrum;
   d. setting the first charge transfer control means to transfer the first charge from the photodetector means to the first charge storage means;
   e. using the first readout means to read out the first charge from the first charge storage means;
   f. setting the first charge transfer control means to prevent transfer of a second charge from the photodetector means to the first charge storage means;
   g. accumulating the second charge in the photodetector means from radiation incident on the photodetector in a second portion of the time-varying energy spectrum emitted by the radiation source corresponding to a second predetermined energy range selected from the energy spectrum;

h. setting the first charge transfer control means to transfer the second charge from the photodetector means to the first charge storage means; and i. reading out the second charge from the first charge storage means.

2. The method as claimed in claim 1, wherein the step of providing an imaging pixel structure includes providing first reset means for eliminating charge from the first charge storage means and the step of setting the first charge transfer control means to prevent transfer of the first charge includes preceding steps of:

a. setting the first charge transfer control means to transfer charge from the photodetector means to the first charge storage means;

b. transferring dark current charge accumulated in the photodetector means to the first charge storage means; and c. using the first reset means to eliminate the dark current charge from the first charge storage means.

3. The method as claimed in claim 1, wherein the step of providing photodetector means comprises providing a scintillator layer coupled to a pinned photodiode or a photo-gate.

4. The method as claimed in claim 1, wherein the step of providing photodetector means comprises providing a photoconductor layer coupled to a diode.

5. The method as claimed in claim 1, wherein the step of providing photodetector means comprises providing a pinned photodiode or a photo-gate which is intrinsically sensitive.

6. The method as claimed in claim 1, wherein the step of providing an imaging pixel structure includes providing dump gate means arranged for controlling charge transfer from the photodetector means to dump drain means and the transfer of charge from the photodetector means to the charge storage means includes selectively transferring charge to the dump drain means to affect the effective sensitivity of the photodetector means.

7. The method as claimed in claim 6, wherein the step of providing an imaging pixel structure includes providing scintillator means for converting radiation from the radiation source to output radiation suitable for detection by the photodetector means and the step of affecting the effective sensitivity of the photodetector means comprises matching the sensitivity of the photodetector means to the output of the scintillator means.

8. The method as claimed in claim 6, wherein charge accumulated from radiation incident on the photodetector means in a third portion of the time-varying spectrum emitted of the radiation source, corresponding to a third predetermined energy range of the energy spectrum, is dumped in the dump drain.

9. The method as claimed in claim 1, wherein the radiation source comprises a DC x-ray source emitting x-ray pulses in the first predetermined energy range.

10. The method as claimed in claim 1, wherein the radiation source comprises a DC x-ray source emitting x-ray pulses in the second predetermined energy range.

11. The method as claimed in claim 1, wherein the radiation source comprises an AC x-ray source and the first predetermined energy range includes a first continuum of energies emitted by the AC x-ray source using tube voltages within a first range.

12. The method as claimed in claim 1, wherein the radiation source comprises an AC x-ray source and the second predetermined energy range includes a second continuum of energies emitted by the AC x-ray source using tube voltages within a second range.

13. A method of selective energy imaging of X-radiation comprising the steps of:

a. providing an imaging pixel structure having photodetector means for converting incident radiation to electrical charge; first charge storage means; first charge transfer control means for controlling transfer of charge from the photodetector to the first charge storage means; first readout means for reading out charge from the first charge storage means second charge storage means; and second charge transfer control means for controlling transfer of charge from the photodetector to the second charge storage means;

b. setting the first charge transfer control means to prevent transfer of a first charge from the photodetector means to the first charge storage means;

c. accumulating the first charge in the photodetector means from radiation incident on the photodetector means in a first portion of a time-varying energy spectrum emitted by a radiation source, corresponding to a first predetermined energy range selected from the energy spectrum;

d. setting the first charge transfer control means to transfer the first charge from the photodetector means to the first charge storage mean;

e. using the first readout means to read out the first charge from the first charge storage means;

f. setting the second charge transfer control means to transfer the second charge from the photodetector means to the second charge storage means; and g. reading out the second charge from the second storage means.

14. The method as claimed in claim 13, wherein the step of providing an imaging pixel structure includes providing a second readout means for reading out charge from the second charge storage means and the step of reading out the second charge from the second storage means comprises using the second readout means.

15. The method as claimed in claim 13, wherein the step of reading out the second storage means comprises transferring the second charge sequentially to the photodetector and the first storage means and using the first readout means to read the second charge from the first storage means.

16. The method as claimed in claim 13, wherein the step of providing photodetector means comprises providing a scintillator layer coupled to a pinned photodiode or a photo-gate.

17. The method as claimed in claim 13, wherein the step of providing photodetector means comprises providing a photoconductor layer coupled to a diode.

18. The method as claimed in claim 13, wherein the step of providing photodetector means comprises providing a pinned photodiode or a photo-gate which is intrinsically sensitive.

19. The method as claimed in claim 13, wherein the radiation source comprises a DC x-ray source emitting x-ray pulses in the first predetermined energy range.

20. The method as claimed in claim 13, wherein the radiation source comprises a DC x-ray source emitting x-ray pulses in the second predetermined energy range.

21. The method as claimed in claim 13, wherein the radiation source comprises an AC x-ray source and the first predetermined energy range includes a first continuum of energies emitted by the AC x-ray source using tube voltages within a first range.

22. The method as claimed in claim 13, wherein the radiation source comprises an AC x-ray source and the second predetermined energy range includes a second continuum of energies emitted by the AC x-ray source using tube voltages within a second range.

23. An imaging pixel structure including photodetector means for converting incident X-radiation to electrical charge; first charge storage means; first charge transfer control means for controlling transfer of charge from the photodetector means to the first charge storage means; and first readout means for reading out charge from the first charge storage means,
  wherein the imaging pixel structure is arranged to accumulate a first charge in the photodetector means from radiation incident on the photodetector means in a first portion of a time-varying energy spectrum emitted by a radiation source, corresponding to a first predetermined energy range selected from the time-varying energy spectrum; to transfer the first charge from the photodetector means to the first charge storage means; and to use the first readout means to read out the first charge from the first charge storage means; and
  wherein the imaging pixel structure is arranged to accumulate a second charge in the photodetector means from radiation incident on the photodetector means in a second portion of the time-varying energy spectrum corresponding to a second predetermined energy range selected from the energy spectrum; to transfer the second charge from the photodetector means to the first charge storage means; and to use the first readout means to read out the second charge from the first charge storage means.

24. The imaging pixel structure as claimed in claim 23, further comprising dump charge transfer control means for transferring charge from the photodetector means to dump drain means arranged to vary an effective sensitivity of the photodetector means.

25. The imaging pixel structure as claimed in claim 24, further including scintillator means for converting radiation from the radiation source to output radiation suitable for detection by the photodetector means, the pixel structure being arranged to vary the effective sensitivity of the photodetector means to match the output of the scintillator means.

26. The imaging pixel structure as claimed in claim 23, wherein the photodetector means comprises a scintillator layer coupled to a pinned photodiode or a photogate.

27. The imaging pixel structure as claimed in claim 23, wherein the photodetector means comprises a photoconductor layer coupled to a diode.

28. The imaging pixel structure as claimed in claim 23, wherein the photodetector means comprises a pinned photodiode or a photo-gate which is intrinsically sensitive.

29. The imaging pixel structure as claimed in claim 23, wherein the first charge storage means includes a sense node.

30. An imaging pixel structure including photodetector means for convening incident X-radiation to electrical charge; first charge storage means; first charge transfer control means for controlling transfer of charge from the photodetector means to the first charge storage means; first readout means for reading out charge from the first charge storage means; second charge storage means; and second charge transfer control means for controlling transfer of charge from the photodetector to the second charge storage means,
  wherein the imaging pixel structure is arranged to accumulate a first charge in the photodetector means from radiation incident on the photodetector means in a first portion of a time-varying energy spectrum emitted by a radiation source, corresponding to a first predetermined energy range selected from the time-varying energy spectrum; to transfer the first charge from the photodetector means to the first charge storage means; to use the first readout means to read out the first charge from the first charge storage means; to accumulate a second charge in the photodetector means from radiation incident on the photodetector means in a second predetermined energy range selected from the energy spectrum of the radiation source; and to transfer the second charge from the photodetector means to the second charge storage means.

31. The imaging pixel structure as claimed in claim 30 further comprising second readout means arranged to read out charge from the second charge storage means.

32. The imaging pixel structure as claimed in claim 30 arranged to transfer charge from the second charge storage means to the photodetector means and from the photodetector means to the first storage means to read out the second charge using the first readout means.

33. The image pixel structure as claimed in claim 30, wherein the second charge storage means includes a storage gate.

34. The imaging pixel structure as claimed in claim 30, further comprising dump charge transfer control means for transferring charge from the photodetector means to dump drain means arranged to vary an effective sensitivity of the photodetector means.

35. The imaging pixel structure as claimed in claim 34, further including scintillator means for converting radiation from the radiation source to output radiation suitable for detection by the photodetector means, the pixel structure being arranged to vary the effective sensitivity of the photodetector means to match the output of the scintillator means.

36. The imaging pixel structure as claimed in claim 30, wherein the photodetector means comprises a scintillator layer coupled to a pinned photodiode or a photo-gate.

37. The imaging pixel structure as claimed in claim 30, wherein the photodetector means comprises a photoconductor layer coupled to a diode.

38. The imaging pixel structure as claimed in claim 30, wherein the photodetector means comprises a pinned photodiode or a photo-gate which is intrinsically sensitive.

39. A sensor array comprising the imaging pixel structure according to claim 30.

40. The sensor array as claimed in claim 39, arranged for x-ray imaging.

41. The sensor array as claimed in claim 40, arranged for intra-oral dental x-ray imaging.

42. The imaging pixel structure as claimed in claim 30, wherein at least one of the first and second charge storage means includes a sense node.

43. A sensor away comprising the imaging pixel structure according to claim 23.

44. The sensor array as claimed in claim 43, arranged for x-ray imaging.

45. The sensor array as claimed in claim 44, arranged for intra-oral dental x-ray imaging.

46. A method of selective energy imaging of X-radiation comprising the steps of:
  a. providing an imaging pixel structure having photodetector means for converting incident radiation to electrical charge; first charge storage means; first charge transfer control means for controlling transfer of charge from the photodetector to the first charge storage means; first readout means for reading out charge from the first charge storage means; and dump gate means arranged for controlling charge transfer from the photodetector means to a dump drain means;

b. setting the first charge transfer control means to prevent transfer of a first charge from the photodetector means to the first charge storage means;

c. accumulating the first charge in the photodetector means from radiation incident on the photodetector means in a first portion of a time-varying energy spectrum emitted by a radiation source, corresponding to a first predetermined energy range selected from the energy spectrum;

d. setting the first charge transfer control means to transfer the first charge from the photodetector means to the first charge storage means, wherein the transfer of the first charge includes selectively transferring charge to the dump drain means to affect the effective sensitivity of the photodetector means; and e. using the first readout means to read out the first charge from the first charge storage means.

47. The method as claimed in claim 46, wherein the step of providing an imaging pixel structure includes providing scintillator means for converting radiation from the radiation source to output radiation suitable for detection by the photodetector means and the step of affecting the effective sensitivity of the photodetector means comprises matching the sensitivity of the photodetector means to the output of the scintillator means.

48. The method as claimed in claim 46, wherein charge accumulated from radiation incident on the photodetector means in a third portion of the time-varying spectrum emitted of the radiation source, corresponding to a third predetermined energy range of the energy spectrum, is dumped in the dump drain.

49. The method as claimed in claim 46, wherein the step of providing photodetector means comprises providing a scintillator layer coupled to a pinned photodiode or a photo-gate.

50. The method as claimed in claim 46, wherein the step of providing photodetector means comprises providing a photoconductor layer coupled to a diode.

51. The method as claimed in claim 46, wherein the step of providing photodetector means comprises providing a pinned photodiode or a photo-gate which is intrinsically sensitive.

52. The method as claimed in claim 46, wherein the radiation source comprises a DC x-ray source emitting x-ray pulses in the first predetermined energy range.

53. The method as claimed in claim 46, wherein the radiation source comprises a DC x-ray source emitting x-ray pulses in the second predetermined energy range.

54. The method as claimed in claim 46, wherein the radiation source comprises an AC x-ray source and the first predetermined energy range includes a first continuum of energies emitted by the AC x-ray source using tube voltages within a first range.

55. The method as claimed in claim 46, wherein the radiation source comprises an AC x-ray source and the second predetermined energy range includes a second continuum of energies emitted by the AC x-ray source using tube voltages within a second range.

* * * * *